United States Patent
Jin et al.

(10) Patent No.: US 11,169,570 B2
(45) Date of Patent: *Nov. 9, 2021

(54) FLEXIBLE DISPLAY PANEL AND DISPLAY APPARATUS INCLUDING THE FLEXIBLE DISPLAY PANEL

(71) Applicant: SAMSUNG DISPLAY CO., LTD., Yongin-si (KR)

(72) Inventors: Dong-Un Jin, Yongin-si (KR); Woo-Jong Lee, Yongin-si (KR); Yang-Wan Kim, Yongin-si (KR); Young-Sik Kim, Yongin-si (KR); Jun-Sang Lyu, Yongin-si (KR); Sang-Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/701,110

(22) Filed: Dec. 2, 2019

(65) Prior Publication Data

US 2020/0103940 A1    Apr. 2, 2020

Related U.S. Application Data

(63) Continuation of application No. 16/114,120, filed on Aug. 27, 2018, now Pat. No. 10,496,133, which is a
(Continued)

(30) Foreign Application Priority Data

Jun. 30, 2011    (KR) .................. 10-2011-0065143
Jun. 14, 2012    (KR) .................. 10-2012-0063871

(51) Int. Cl.
*G06F 1/16*     (2006.01)
*G06F 3/041*    (2006.01)
*H01L 51/52*    (2006.01)

(52) U.S. Cl.
CPC ............ *G06F 1/1637* (2013.01); *G06F 3/041* (2013.01); *G06F 2203/04103* (2013.01);
(Continued)

(58) Field of Classification Search
CPC ......... G06F 1/1637; G06F 2203/04103; G06F 3/041; G06F 1/1652; G06F 1/1677;
(Continued)

(56) References Cited

U.S. PATENT DOCUMENTS 5,436,744 A  *  7/1995  Arledge .............. G02F 1/13452
                                                         349/150
8,105,126 B2      1/2012  Jiang et al.
(Continued)

FOREIGN PATENT DOCUMENTS

CN    101620327 A    1/2010
CN    101943965 A    1/2011
(Continued)

OTHER PUBLICATIONS

English machine translation of relevant portion of Japanese Publication 2002-006293 dated Jan. 9, 2002, listed above, (3 pages).
(Continued)

*Primary Examiner* — Richard J Hong
(74) *Attorney, Agent, or Firm* — Lewis Roca Rothgerber Christie LLP

(57)    ABSTRACT

A flexible display panel including: a flexible panel including a first region including a display region and oriented on a first plane and a second region including a non-display region and oriented on a second plane different from the first plane; and a flexible encapsulation member disposed on the flexible panel so as to encapsulate at least the display region.

20 Claims, 15 Drawing Sheets

Related U.S. Application Data continuation of application No. 13/535,298, filed on Jun. 27, 2012, now Pat. No. 10,061,356.

(52) U.S. Cl.
CPC ........ *H01L 51/524* (2013.01); *H01L 51/5256* (2013.01); *H01L 2251/5338* (2013.01)

(58) Field of Classification Search
CPC ........... H01L 2251/5338; H01L 51/524; H01L 51/5256; H01L 51/003; G09G 3/344; H05K 3/0014; G02F 1/133305; G02F 1/13452

See application file for complete search history.

(56) References Cited

U.S. PATENT DOCUMENTS

| | | | |
|---|---|---|---|
| 8,736,162 B2 | 5/2014 | Jin et al. | |
| 10,061,356 B2 | 8/2018 | Jin et al. | |
| 2003/0201974 A1* | 10/2003 | Yin | G06F 1/1677 345/158 |
| 2009/0021666 A1* | 1/2009 | Chen | G02F 1/133305 349/58 |
| 2009/0121333 A1 | 5/2009 | Aitken et al. | |
| 2010/0001971 A1 | 1/2010 | Jiang et al. | |
| 2010/0001976 A1 | 1/2010 | Jiang et al. | |
| 2010/0011291 A1 | 1/2010 | Nurmi | |
| 2010/0065832 A1 | 3/2010 | Sugimoto | |
| 2010/0103138 A1* | 4/2010 | Huang | H05K 3/0014 345/174 |
| 2010/0156841 A1 | 6/2010 | Wang et al. | |
| 2010/0171683 A1* | 7/2010 | Huitema | G09G 3/344 345/55 |
| 2010/0253902 A1 | 10/2010 | Yamazaki et al. | |
| 2010/0293782 A1 | 11/2010 | Yamazaki et al. | |
| 2010/0308335 A1 | 12/2010 | Kim et al. | |
| 2010/0315570 A1 | 12/2010 | Mathew et al. | |
| 2010/0321779 A1 | 12/2010 | Hane et al. | |
| 2011/0006925 A1 | 1/2011 | Cheng et al. | |
| 2011/0007042 A1* | 1/2011 | Miyaguchi | G06F 1/1652 345/204 |
| 2011/0050657 A1 | 3/2011 | Yamada | |
| 2011/0235160 A1 | 9/2011 | Hsieh et al. | |
| 2011/0236682 A1 | 9/2011 | Okamoto et al. | |
| 2011/0242462 A1 | 10/2011 | Hirakata et al. | |
| 2011/0261002 A1 | 10/2011 | Verthein | |
| 2011/0285273 A1 | 11/2011 | Albrecht et al. | |
| 2012/0107978 A1* | 5/2012 | Shin | H01L 51/003 438/29 |
| 2012/0188184 A1 | 7/2012 | Lin et al. | |
| 2012/0212433 A1 | 8/2012 | Lee et al. | |
| 2012/0242635 A1 | 9/2012 | Erhart et al. | |
| 2013/0063891 A1* | 3/2013 | Martisauskas | G06F 1/1652 361/679.56 |
| 2013/0328025 A1 | 12/2013 | Ono | |

FOREIGN PATENT DOCUMENTS

| | | |
|---|---|---|
| CN | 101996535 A | 3/2011 |
| CN | 102855821 A | 1/2013 |
| CN | 202887620 U | 4/2013 |
| JP | 2002-006293 | 1/2002 |
| JP | 2010-35107 A | 2/2010 |
| JP | 2010-282966 | 12/2010 |
| JP | 2011-003537 | 1/2011 |
| JP | 2011-34066 A | 2/2011 |
| JP | 2011-047977 A | 3/2011 |
| KR | 10-2008-0073225 A | 8/2008 |
| KR | 10-2011-0028650 | 3/2011 |
| KR | 10-2011-0045910 A | 5/2011 |
| KR | 10-2011-0068169 | 6/2011 |
| WO | WO 2009/086095 A2 | 7/2009 |

OTHER PUBLICATIONS

EPO Office action dated Mar. 30, 2015, for corresponding European Patent application 12174497.3, (8 pages).

Extended European Search Report dated Feb. 17, 2014, for corresponding European Patent Application No. 12174497.3, (8 pages).

JPO Office action dated Feb. 16, 2016, for corresponding Japanese Patent application 2012-145776, (6 pages).

KIPO Notice of Allowance dated Oct. 20, 2014, for Korean priority Patent application 10-2012-0063871, (6 pages).

Office action for Korean Patent Application No. 10-2012-0063871 dated Sep. 26, 2013, pp. 1-7.

SIPO Office action dated Jun. 19, 2015, for corresponding Chinese Patent application 201210227989.0, (16 pages).

\* cited by examiner

FLEXIBLE DISPLAY PANEL AND DISPLAY APPARATUS INCLUDING THE FLEXIBLE DISPLAY PANEL

CROSS-REFERENCE TO RELATED PATENT APPLICATIONS

This application is a continuation of U.S. patent application Ser. No. 16/114,120, filed Aug. 27, 2018, which is a continuation of U.S. patent application Ser. No. 13/535,298, filed Jun. 27, 2012, now U.S. Pat. No. 10,061,356, which claims priority to and the benefit of Korean Patent Application Nos. 10-2011-0065143, filed Jun. 30, 2011, and 10-2012-0063871, filed Jun. 14, 2012, the entire content of all of which is incorporated herein by reference.

BACKGROUND OF THE INVENTION

1. Field of the Invention

One or more embodiments of the present invention relate to a flexible display panel and a display apparatus including the flexible display panel.

2. Description of the Related Art

Display apparatuses refer to apparatuses that display an image signal. Such display apparatuses include all apparatuses, such as TVs, computer monitors, personal digital assistants (PDAs) and smart devices that are increasingly in demand, which display an image signal input by an external device.

A flat panel display module with high image quality, such as an organic light-emitting display panel, a liquid crystal display (LCD) panel, a plasma display panel (PDP), or the like, is used in display apparatuses.

The flat panel display module includes a display region in which an image is displayed, and a non-display region in which various circuits and wirings for supplying an image signal to the display region are disposed. In this regard, the non-display region is outside the display region on the same plane as that of the display region.

As demand for high image quality and various applications of display apparatuses is recently increasing, the number of circuits and wirings disposed in the non-display region of the flat panel display module is also increasing. Thus, the area of the non-display region has increased, which causes a reduction in the percentage of the display region that is recognized by a user.

SUMMARY OF THE INVENTION

One or more embodiments of the present invention provide a flexible display panel that significantly decreases the ratio of non-display regions to a display region recognized by a user, and a display apparatus including the flexible display panel.

According to an aspect of the present invention, there is provided a flexible display panel including: a flexible panel including a first region including a display region and oriented on a first plane and a second region including a non-display region and oriented on a second plane different from the first plane; and a flexible encapsulation member disposed on the flexible panel so as to encapsulate at least the display region.

The display region may be configured to be viewed from a first direction in which the first plane is oriented, and the non-display region may be configured not to be viewed from the first direction.

An area ratio of the non-display region to the display region visible from a first direction in which the first plane is oriented, may be smaller than an area ratio of the non-display region to the display region visible from the first direction than if the non-display region was oriented in the first direction.

A border region having a curvature radius may be between the first region and the second region.

The curvature radius may have a substantially constant value.

The curvature radius may be between about 0.01 mm and about 10 mm.

The curvature radius may be between about 0.01 mm and about 1 mm.

A curved surface of the border region may be arc-shaped.

The display region may extend into the border region.

The non-display region may extend into border region.

Each of the display region and the non-display region may extend into the border region.

The first region may be substantially planar.

The second region may be substantially planar.

The flexible substrate may further include a third region extending from an edge of the second region and extending in a direction towards the first region.

The non-display region may extend from the second region into the third region.

A pad unit may be located in the third region.

The flexible display panel may further include a barrier layer located between the flexible substrate and at least one of the first region and the second region.

The flexible display panel may further include a first protective film located on one side of the flexible panel and a second protective film located on one side of the flexible encapsulation member.

The first protective film and the second protective film may be located so as to cover the display region and the non-display region of the flexible panel.

The first protective film and the second protective film may be located to be symmetrical to each other.

At least one of the first protective film and the second protective film may include a polarization film.

The first protective film may cover an edge of the flexible panel, and the second protective film may cover an edge of the flexible encapsulation member.

The flexible encapsulation member may include at least one of an inorganic insulating layer and an organic insulating layer.

The flexible display panel may further include a touch panel located on at least one side of the flexible substrate and the flexible encapsulation member and on which an image of the display region is displayed.

The touch panel may include a flexible film that generally corresponds to a shape of the flexible display panel.

The touch panel may include a touch region located on the flexible film and generally corresponding to the display region, and a wiring region outside the touch region.

According to another aspect of the present invention, there is provided a display apparatus including a flexible display panel including a flexible panel including a first region including a display region and oriented on a first plane and a second region including a non-display region and oriented on a second plane different from the first plane, a flexible encapsulation member disposed on the flexible panel so as to encapsulate at least the display region, and a support unit for maintaining a shape of the flexible display panel.

The support unit may be disposed on the flexible encapsulation member so as to correspond to a shape of the flexible display panel.

The display apparatus may further include a first protective film located on one side of the flexible panel and a second protective film located on one side of the flexible encapsulation member, wherein the first protective film and the second protective film are located so as to cover the display region and the non-display region of the flexible panel.

The display apparatus may further include a flexible touch panel located on at least one side of the flexible panel and the flexible encapsulation member and on which an image of the display region is displayed, so as to correspond to a shape of the flexible panel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings in which exemplary embodiments of the invention are shown.

Figure 1:
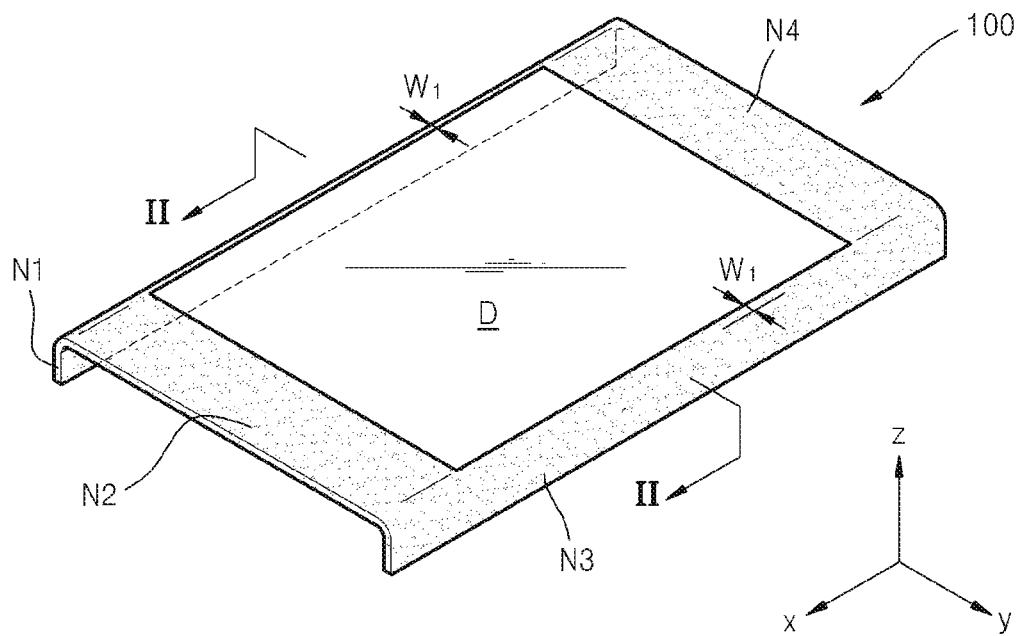
FIG. 1 is a schematic perspective view of a flexible display panel according to an embodiment of the present invention.
Figure 2:
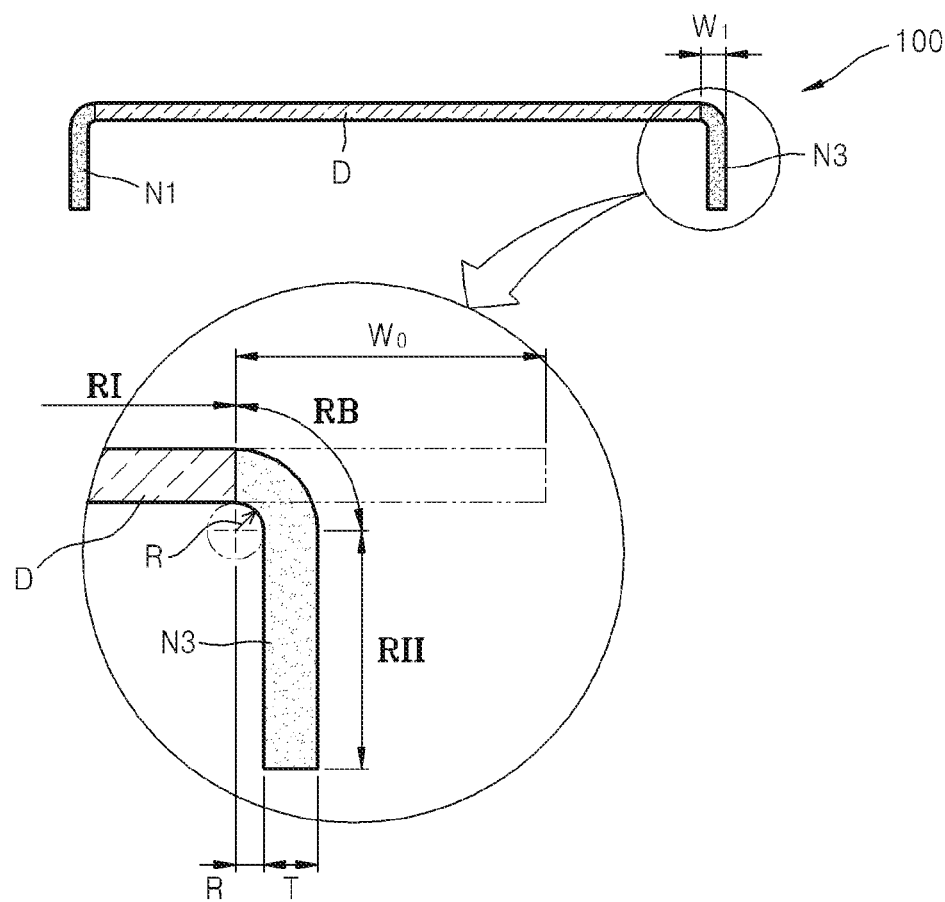
FIG. 2 is a cross-sectional view of the flexible display panel illustrated in FIG. 1, taken along a line II-II of FIG. 1.

FIG. 1 is a schematic perspective view of a flexible display panel 100 according to an embodiment of the present invention, and FIG. 2 is a cross-sectional view of the flexible display panel 100 illustrated in FIG. 1, taken along a line II-II of FIG. 1.

Referring to FIGS. 1 and 2, the flexible display panel 100 includes a display region D oriented on a first plane (x-y plane), and non-display regions N1, N2, N3 and N4 oriented on a second plane (y-z plane) different from the first plane (x-y plane) and outside the display region D. The non-display regions N1 and N3 that face each other across the display region D among the non-display regions N1, N2, N3 and N4 are folded in a direction −z opposite to a direction z in which the display region D is displayed.

Since the non-display regions N1 and N3 are folded in the direction −z opposite to the direction z in which the display region D is displayed, when the user sees the flexible display panel 100 from the front (z-direction) of the display region D, the user recognizes a width $W_1$ at which the non-display regions N1 and N3 are folded as a border that surrounds right and left sides of the display region D.

Referring to FIG. 2, since the width $W_1$ at which the non-display regions N1 and N3 are folded becomes much smaller than an original width $W_0$ before the non-display regions N1 and N3 are folded, the user recognizes that the border of the display region D formed by the non-display regions N1 and N3 is significantly decreased in size. When there is no change in the area of the display region D before and after the non-display regions N1 and N3 are folded, respectively, the area ratio of the non-display regions N1 and N3 to the display region D recognized by the user is decreased, and thus, the effects of relatively enlarging the display region D may be shown. Since a width of the display region D may be enlarged by the decreased width $(W_0-W_1)$ of the non-display regions N1 and N3, when the flexible display panel 100 is applied to a display apparatus having the same specification as that of the flexible display panel 100, the flexible display panel 100 may implement an enlarged image screen compared to other display panels.

The folded width $W_1$ of the non-display regions N1 and N3 may be determined by the sum of an inner curvature radius R of a portion in which the display region D and the non-display regions N1 and N3 are folded and a thickness T of the flexible display panel 100. Although described below, since the inner curvature radius R of the portion in which the display region D and the non-display regions N1 and N3 are folded and the thickness T of the flexible display panel 100 may be significantly decreased, the user may recognize the display region D formed by the non-display regions N1 and N3 as being almost borderless.

Figure 3:
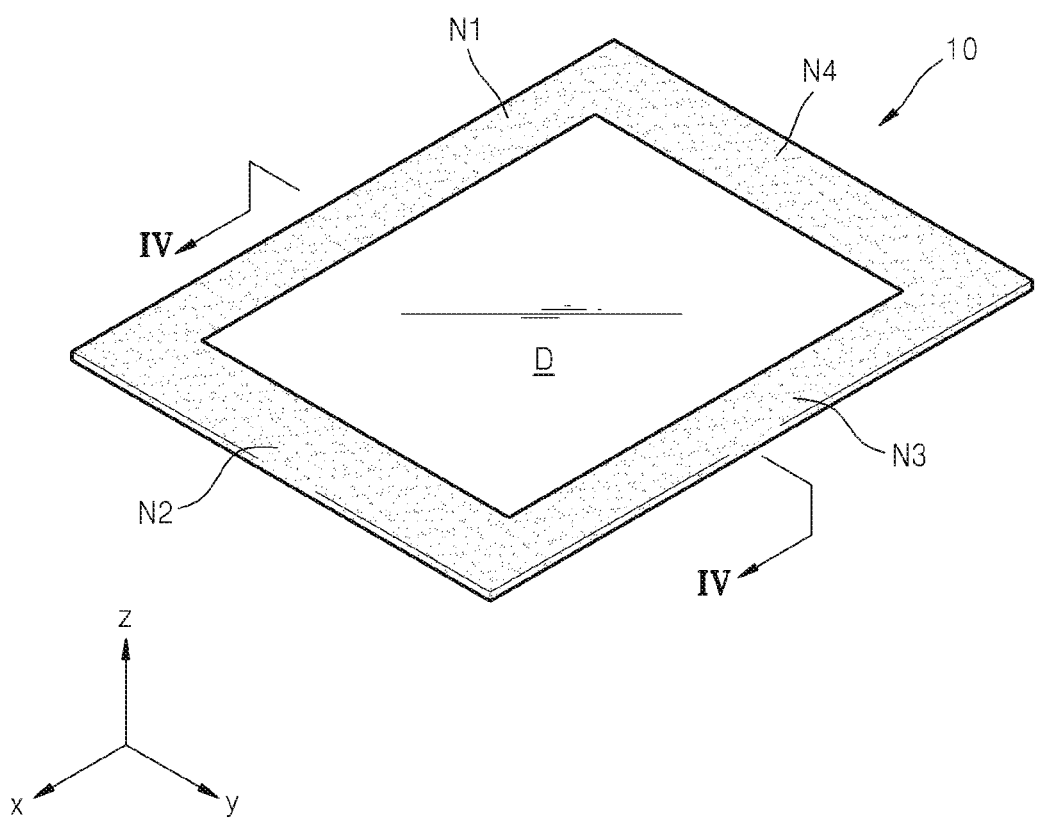
FIG. 3 is a schematic perspective view of a flat display panel according to a comparative example of FIG. 1.
Figure 4:
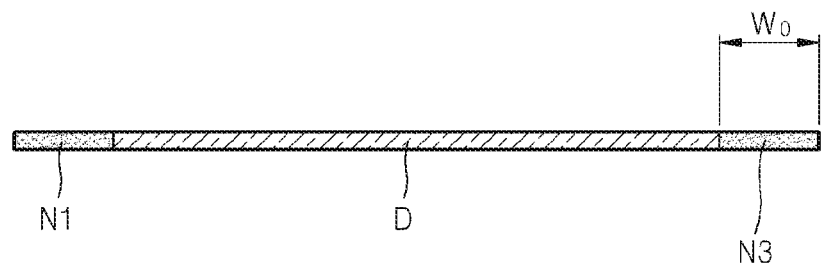
FIG. 4 is a cross-sectional view of the flat display panel illustrated in FIG. 3, taken along a line IV-IV of FIG. 3.

FIG. 3 is a schematic perspective view of a flat display panel 10 in which non-display regions N1, N2, N3 and N4 are not folded as a comparative example of FIG. 1, and FIG. 4 is a cross-sectional view of the flat display panel 10 illustrated in FIG. 3, taken along a line IV-IV of FIG. 3.

Referring to FIGS. 3 and 4, the flat display panel 10 in which the non-display regions N1, N2, and N3 and N4 are not folded includes a display region D and the non-display regions N1, N2, N3, N4 outside the display region D.

Since the non-display regions N1 and N3 are not folded, when the user sees the flat display panel 10 from the front (z-direction) of the display region D, the user recognizes the original width $W_0$ of the non-display regions N1 and N3 as a border that surrounds the right and left sides of the display region D. Thus, a thicker border of the display region D formed by the non-display regions N1 and N2 is recognized by the user, compared to the flexible display panel 100 of FIG. 1 described above.

When the area of the display region D and the non-display regions N1 and N3 of the flexible display panel 100 of FIG. 1 is the same as the area of the display region D and the non-display regions N1 and N3 of the flat display panel 10 of FIG. 3, the area ratio of the non-display regions N1 and N3 to the display region D of the flexible display panel 100 of FIG. 1 recognized by the user is decreased compared to that of the flat display panel 10 of the comparative example so that the effects of enlarging a display screen may be shown.

In the case of n the case of the n the case of the flat display panel 10 according to the comparative example, in order to reduce the area of the non-display regions N1 and N3, the number of various circuits or wirings disposed in the non-display regions N1 and N3 has to be decreased, or line widths of circuits or wirings have to be decreased. However, since demand for high image quality and various applications of a display apparatus is increasing, there is a limitation in reducing the number of circuits or wirings. In addition, there is a process difficulty in reducing line widths of the circuits or wirings. However, in the flexible display panel 100 of FIG. 1, the area of the non-display regions N1 and N3 recognized by the user may be decreased without reducing the number of circuits or wirings disposed in the non-display regions N1 and N3 or without reducing line widths of the circuits or wirings.

Figure 5:
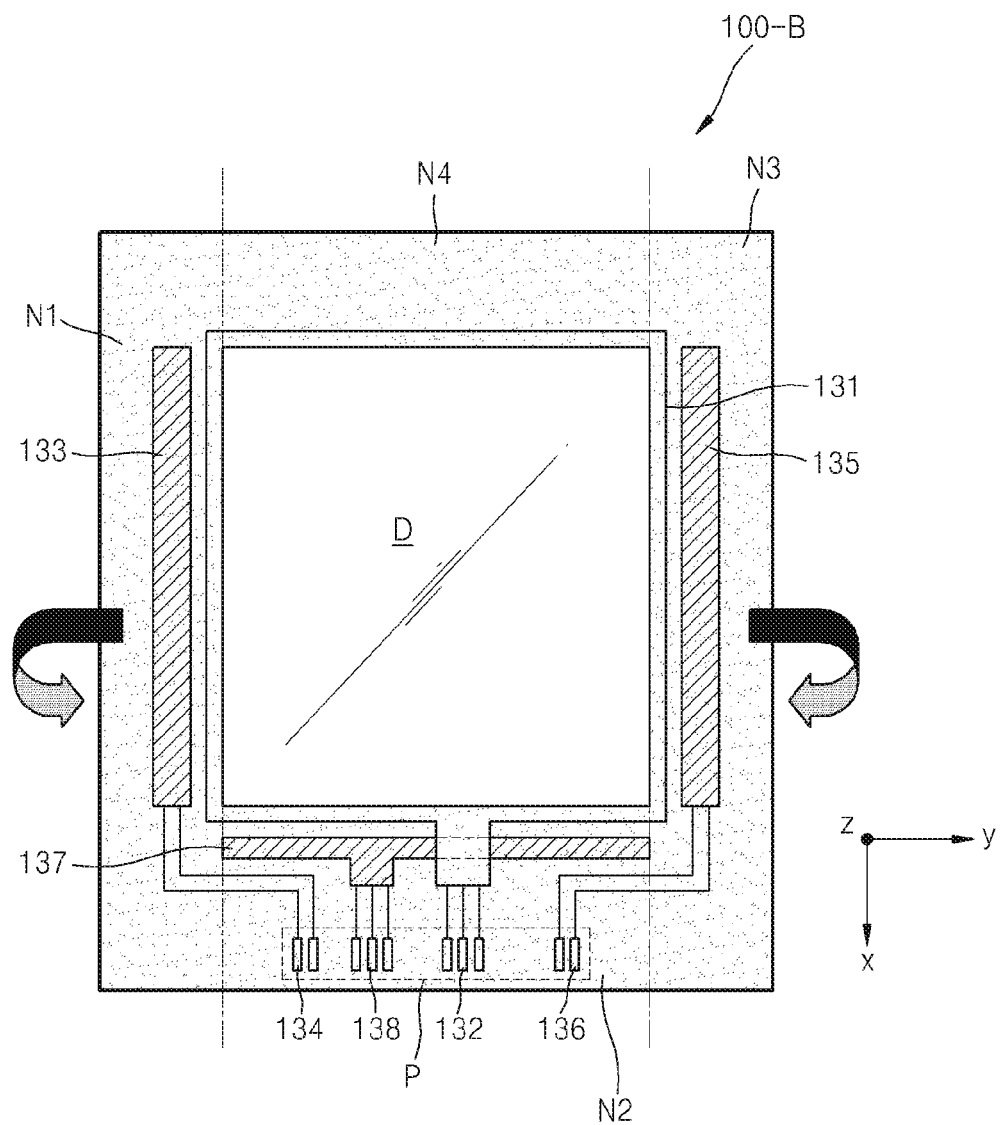
FIG. 5 is a schematic plan view of an example of a flexible display panel before non-display regions of FIG. 1 are folded.
Figure 6:
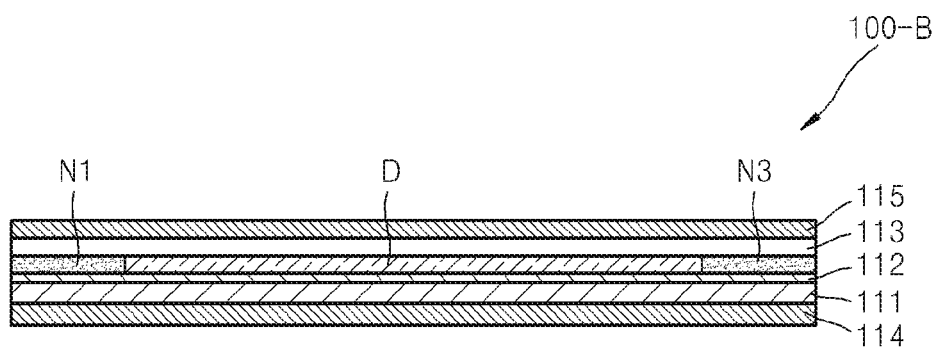
FIG. 6 is a schematic cross-sectional view of FIG. 5.
Figure 7:
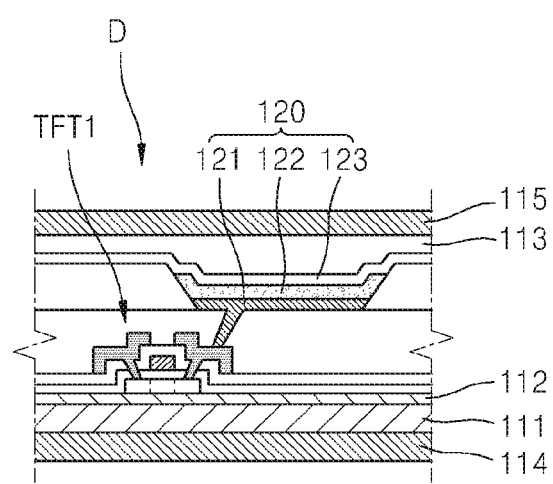
FIG. 7 is a cross-sectional view of an example of display regions of FIG. 5.

FIG. 5 is a schematic cross-sectional plan view of an example of a flexible display panel 100-B before the non-display regions N1 and N3 of FIG. 1 are folded, and FIG. 6 is a schematic cross-sectional view of FIG. 5, and FIG. 7 is a cross-sectional view of an example of a display region D of FIG. 5.

Referring to FIGS. 5 through 7, the flexible display panel 100-B before the non-display regions N1 and N3 are folded includes a flexible substrate 111, a barrier layer 112 located on the flexible substrate 111, the display region D and non-display regions N1, N2, N3 and N4 disposed on the barrier layer 112, a flexible encapsulation member 113, a first protective film 114 located on one side of the flexible substrate 111, and a second protective film 115 located on one side of the flexible encapsulation member 113.

The flexible substrate 111 may be formed of a plastic material having excellent heat resistance and durability, such as polyethylene ether phthalate, polyethylene naphthalate, polycarbonate, polyarylate, polyetherimide, polyethersulfone, polyimide, or the like. However, the present invention is not limited thereto, and the flexible substrate 111 may be formed of various flexible materials.

The barrier layer 112 may be located on the flexible substrate 111. The barrier layer 112 may be formed of at least one of an inorganic layer and an organic layer. The barrier layer 112 prevents unnecessary components from transmitting into the flexible substrate 111 and from permeating into the display region D.

The display region D and the non-display regions N1, N2, N3 and N4 outside the display region D may be disposed on the barrier layer 112.

An image signal is displayed in the display region D, and various display devices (not shown), such as organic light-emitting devices, liquid crystal display (LCD) devices, electrophoresis devices, and the like may be disposed in the display region D. In the current embodiment, at least one organic light-emitting device 120 will be described. Various devices, such as thin film transistors (TFTs) (not shown) and capacitors (not shown) for driving display devices and the like may also be disposed in the display region D.

The organic light-emitting device 120 is disposed in the display region D. The organic light-emitting device 120 includes a pixel electrode 121, an opposite electrode 123 that is a common layer, and an organic emission layer 122 interposed between the pixel electrode 121 and the opposite electrode 123. The pixel electrode 121 is electrically connected to a driving TFT TFT1 disposed on the flexible substrate 111. Although not shown in FIG. 6, the organic light-emitting device 120 is electrically connected to at least one switching TFT and storage capacitor, thereby emitting light from the display region D.

Light may be emitted from the organic emission layer 122 towards the flexible substrate 111 or the flexible encapsulation member 113. In the current embodiment, a top-emission type display device in which an image is displayed towards the flexible encapsulation member 113 is described. However, the present invention is not limited thereto and may be applied to a bottom-emission type display device in which an image is displayed towards the flexible substrate 111. In the case of the bottom-emission type display device, the non-display regions N1 and N3 are folded in a direction opposite to a direction −z in which an image is displayed, that is, towards the flexible encapsulation member 113 (z-direction).

Various circuits (not shown) and wirings (not shown) for supplying an image signal to the display device disposed in the display region D may be disposed in the non-display regions N1, N2, N3 and N4.

Referring to FIG. 5, an electrode power supply line 131 for supplying power to the opposite electrode 123, and a terminal portion 132 of the electrode power supply line 131 are disposed in the non-display regions N1, N2, N3 and N4. A scan circuit unit 133 for transmitting a driving signal to the display region D and a terminal portion 134 of the scan circuit unit 133 are disposed in the non-display regions N1 and N2. A data circuit unit 135 for transmitting a data signal to the display region D and a terminal portion 136 of the data circuit unit 135 are disposed in the non-display regions N2 and N3. A driving power wiring unit 137 for supplying driving power to the display region D and a terminal portion 138 of the driving power wiring unit 137 are disposed in the non-display region N2. A pad unit P, on which the terminal portions 132, 134, 136, and 138 are disposed, is located in the non-display region N2.

The various circuits, wirings, and terminal portions illustrated in FIG. 5 are just illustrative of an example of the non-display regions N1, N2, N3 and N4. In other words, obviously, various circuits, wirings, and terminal portions disposed in the non-display regions N1, N2, N3 and N4 may have different configurations from those of FIG. 5.

The flexible encapsulation member 113 for encapsulating at least the display region D may be disposed in the display region D and the non-display regions N1, N2, N3 and N4. The flexible encapsulation member 113 may be an encapsulation thin layer. The encapsulation thin layer may have a structure including a plurality of inorganic insulating layers or a structure in which an inorganic insulating layer and an organic insulating layer are alternately stacked.

The first protective film 114 may be located on one side of the flexible substrate 111. Although not shown, an adhesive may be further injected between the flexible substrate 111 and the first protective film 114. The second protective film 115 may be located on one side of the flexible encapsulation member 113. An adhesive may be further injected between the flexible encapsulation member 113 and the second protective film 115.

The first protective film 114 and the second protective film 115 may have the same material property and may serve to improve a mechanical strength of the flexible display panel 100. The first protective film 114 and the second protective film 115 may be formed of flexible material.

In addition, at least one of the first protective film 114 and the second protective film 115 may have a polarization function. Here, the arrangement of a protective film having a polarization function may be determined based on a direction in which the organic light-emitting device 120 emits light. For example, when the organic light-emitting device 120 is a top-emission type display device which emits light towards the second protective film 115 so as to display an image, the second protective film 115 is configured to have a polarization function. Meanwhile, when the organic light-emitting device 120 is a bottom-emission type display device which emits light towards the first protective film 114 so as to display an image, the first protective film 114 is configured to have a polarization function. In addition, when the organic light-emitting device 120 is a top and bottom emission type display device, both the first protective film 114 and the second protective film 115 may have a polarization function.

Figure 8:
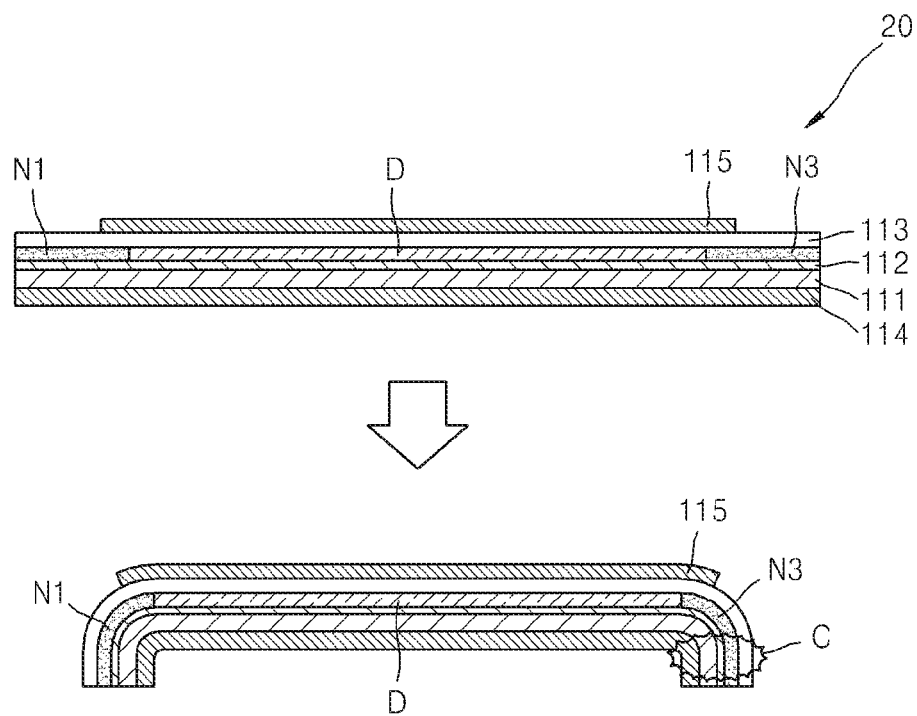
FIG. 8 is a schematic cross-sectional view of a flat display panel before or after being bent according to a comparative example of FIG. 1.

FIG. 8 is a schematic cross-sectional view of a flat display panel 20 before or after being bent according to a comparative example of FIG. 1.

When the second protective film 115 has a polarization function, according to the related art, the first protective film 114 is located to cover the flexible substrate 111 fully, as illustrated in FIG. 8, whereas the second protective film 115 is located to cover only the display region D fully.

In this state, when the flat display panel 20 is bent, in the non-display regions N1 and N3, a bending moment varies between a portion including the second protective film 115 and a portion that does not include the second protective film 115. Thus, cracks may occur in a region C in which metal layers, such as various circuits and wirings for forming the non-display regions N1 and N3 between the portion including the second protective film 115 and the portion that does not the second protective film 115, are formed. The cracks may induce abnormal lighting of the flat display panel 20, which may be a cause of defects.

In order to prevent this problem, in the present embodiment, the first protective film 114 and the second protective film 115 are located to cover the display region D and the non-display regions N1 and N3 of the flexible display panel 100-B. The first protective film 114 and the second protective film 115 may be located to be symmetrical to each other. For example, the first protective film 114 may be located so as to cover both ends of the flexible substrate 111, and the second protective film 115 may be located so as to cover both ends of the flexible encapsulation member 113.

Through the above structure, the same bending moment may be applied to a region in which metal layers, such as various circuits and wirings for forming the non-display regions N1 and N3 folded at a border between the non-display regions N1 and N3 and the display region D, so that damage or cracks of the region in which metal layers are formed, may be prevented.

Since the flexible substrate 111 that constitutes the flexible display panel 100, is flexible, it is difficult to form the display region D and the non-display regions N1 and N3 directly on the flexible substrate 111. Thus, although not shown, a method of manufacturing the flexible display panel 100 includes: forming the flexible substrate 111 on a glass substrate (not shown) having rigidity; forming a barrier layer 112 on the flexible substrate 111; forming the display region D and the non-display regions N1 and N3 on the barrier layer 112; forming the flexible encapsulation member 113 so as to cover the display region D; attaching the second protective film 115 to the flexible encapsulation member 113 by using a second adhesive (not shown); separating the glass substrate (not shown) from the flexible substrate 111; and attaching the first protective film 114 to the flexible substrate 111 by using a first adhesive (not shown).

The first protective film 114 and the second protective film 115 according to the present embodiment may be applied to other embodiments of the present invention to be described as below.

When the non-display regions N1 and N3 on right and left sides of the display region D of the flexible display panel 100-B of FIG. 5 are folded in a direction –z opposite to a direction (z-direction, see FIG. 1) in which the display region D is displayed, the flexible display panel 100 illustrated in FIGS. 1 and 2 is constituted.

In the flexible display panel 100, when the non-display regions N1 and N3 are folded, a curved surface may be formed at a border between the display region D and the non-display regions N1 and N3.

Referring back to FIG. 2, a border region RB including a predetermined curved surface is between the display region D (first region RI) and the non-display region N3 (second region RII). The border region RB is formed as a curved surface having the inner curvature radius R.

In the current embodiment, the non-display region N3 of the second region RII extends from the border region RB. When the user sees the flexible display panel 100 folded in the front (z-direction) of the display region D, the width $W_1$ of the non-display region N3 recognized by the user from the front of the display region D is recognized as the sum of the inner curvature radius R of the portion in which the display region D and the non-display region N3 are folded and the thickness T of the flexible display panel 100. In the current embodiment, the width $W_1$ of the non-display region N3 recognized by the user is the same as the border region RB.

The thickness T of the flexible display panel 100 may be selected in a range of several tens of micrometers (μm) and several hundreds of micrometers (μm). In particular, since, in the case of a small display apparatus, the thickness of a flexible display panel may be selected from a narrower range than the range described above, the width $W_1$ of the non-display region recognized by the user may be further decreased. Obviously, the present invention is not limited to the thickness range described above, and a wider thickness range than the thickness range described above may be selected if necessary.

Figure 9:
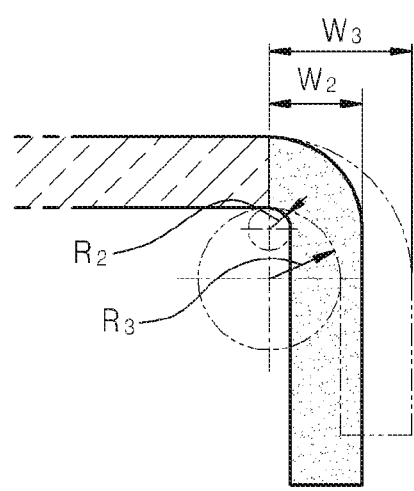
FIG. 9 illustrates the relationship between an inner curvature radius of a portion in which a display region and a non-display region are folded and widths of the non-display region that are recognized by a user.

FIG. 9 illustrates the relationship between the inner curvature radius R of the portion in which the display region D and the non-display region N3 are folded and widths $W_2$ and $W_3$ of the non-display region N3 recognized by a user.

Referring to FIG. 9, when it is assumed that the thickness T of the flexible display panel 100 is uniform and the non-display region N3 is folded so that the border region RB has a curvature radius $R_2$, the width $W_2$ of the non-display region N3 recognized by the user is the sum of the curvature radius $R_2$ and the thickness T of the flexible display panel 100 ($W_2=R_2+T$). When the non-display region N3 is folded so that the border region RB has a larger curvature radius $R_3$ than the curvature radius $R_2$, the width $W_3$ of the non-display region N3 recognized by the user is the sum of the curvature radius $R_3$ and the thickness T of the flexible display panel. In other words, as the curvature radius increases ($R_3>R_2$), the width $W_3$ of the non-display region N3 recognized by the user increases.

The inner curvature radius of the portion in which the display region D and the non-display region N3 are folded may be between 0.01 mm and 10 mm. When the inner curvature radius of the portion is less than 0.01 mm, due to bending stress, the flexible display panel 100 may not be maintained in a folded state, and when the inner curvature radius of the portion is greater than 10 mm, the width $W_3$ of the non-display region N3 increases. In particular, in the case of a small display apparatus, the range of the curvature radius may be selected as being less than 1 mm so that the width $W_3$ of the non-display region N3 recognized by the user may be further decreased.

Figure 10:
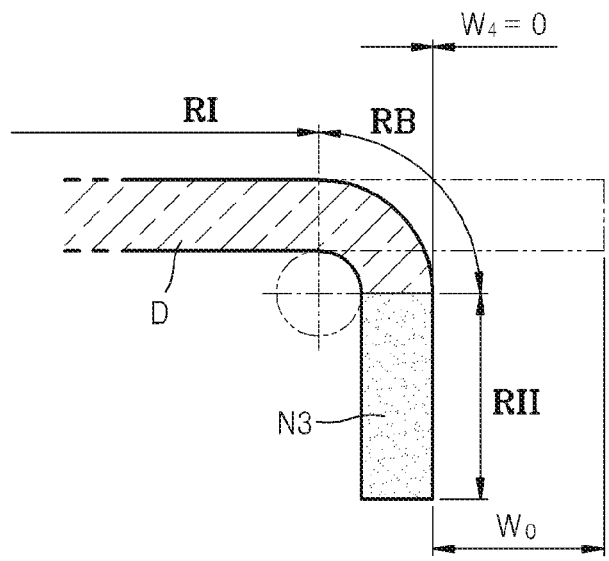
FIGS. 10 and 11 are cross-sectional views of examples of border regions.

Referring to FIG. 10, the display region D of the first region RI extends from the border region RB. When the user sees the flexible display panel 100 folded in the front of the display region D, a width $W_4$ of the non-display region N3 recognized by the user is 0. Thus, in the current embodiment, the user may recognize that the non-display region N3 is almost borderless.

Figure 11:
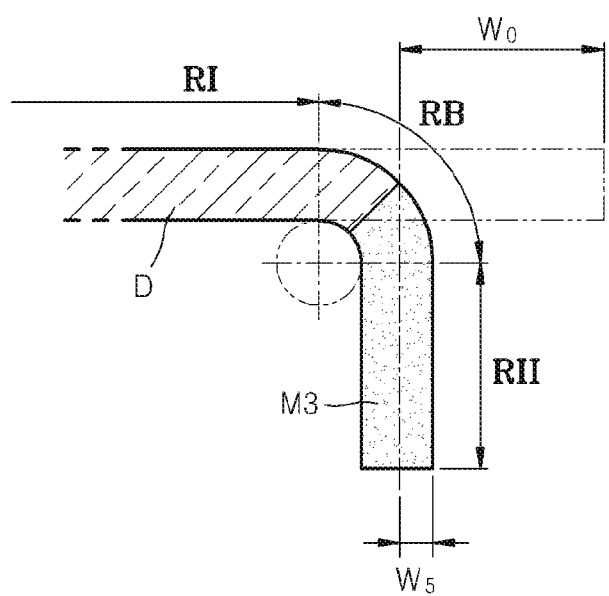

Referring to FIG. 11, both the display region D of the first region RI and the non-display region N3 of the second region RII may be disposed in the border region RB. In this regard, a width $W_5$ of the non-display region N3 recognized by the user is greater than the width $W_4$ of the non-display region N3 recognized by the user, as illustrated in FIG. 10 and is less than the width $W_1$ of the non-display region N3 recognized by the user, as illustrated in FIG. 2. However, even in this case, the width $W_5$ of the non-display region N3 recognized by the user is recognized as being smaller than that of the flat display panel 10 of FIGS. 3 and 4 in which the non-display regions N1 and N3 are not folded.

In the case of the flexible display panel 100 of FIG. 1, the non-display regions N1 and N3 on the right and left sides of the display region D are folded. However, the present invention is not limited thereto. In other words, the spirit of the present invention also applies to a case where any one of the non-display regions N1 and N3 is folded.

Figure 12:
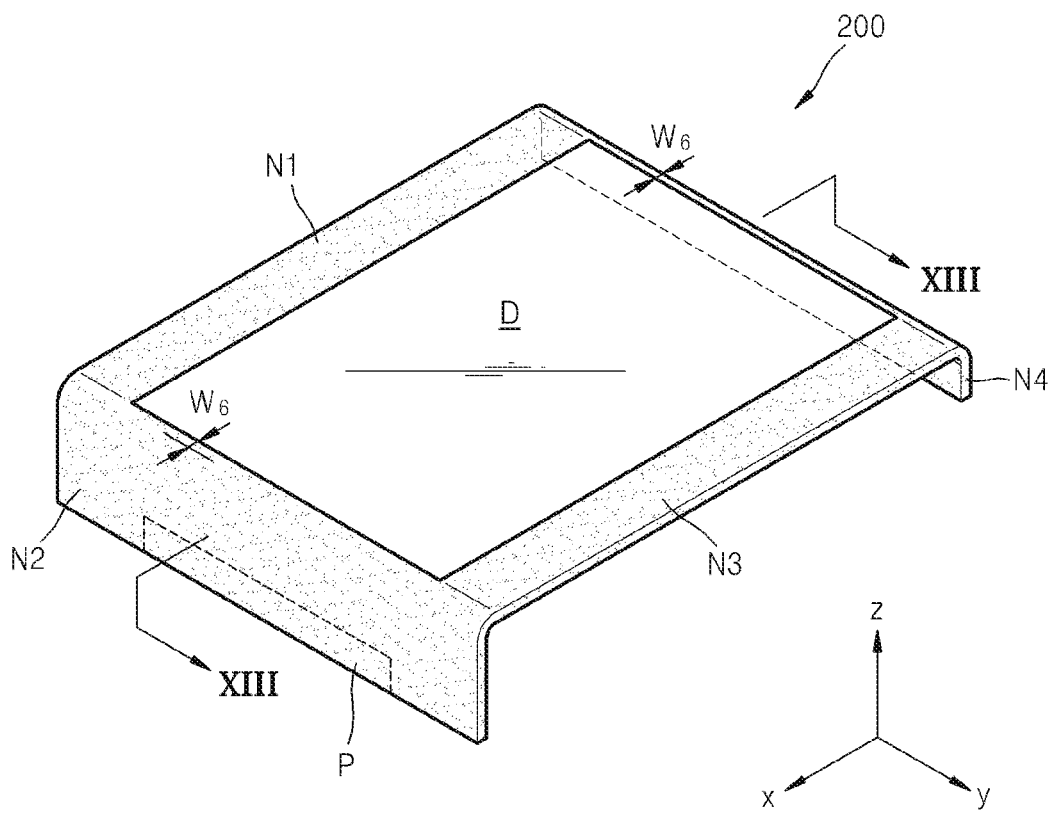
FIG. 12 is a schematic perspective view of a flexible display panel according to another embodiment of the present invention.
Figure 13:
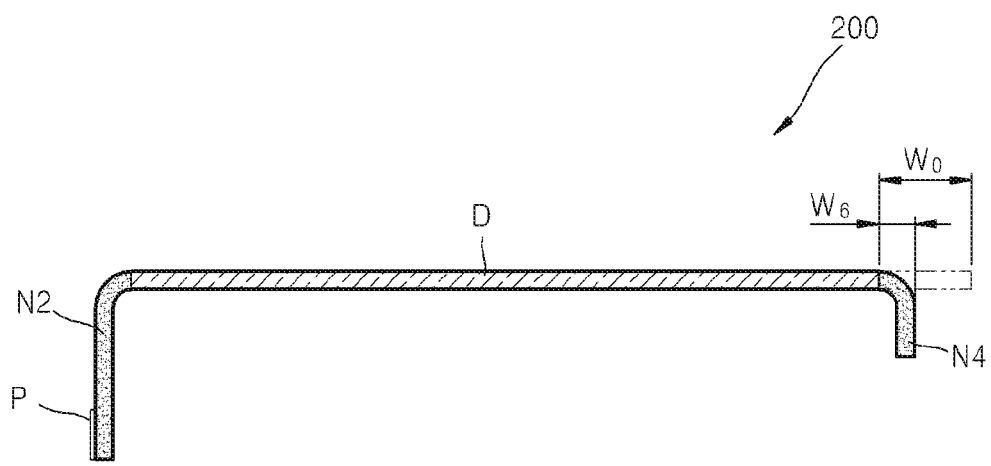
FIG. 13 is a cross-sectional view of the flexible display panel illustrated in FIG. 12, taken along a line XIII-XIII of FIG. 12.
Figure 14:
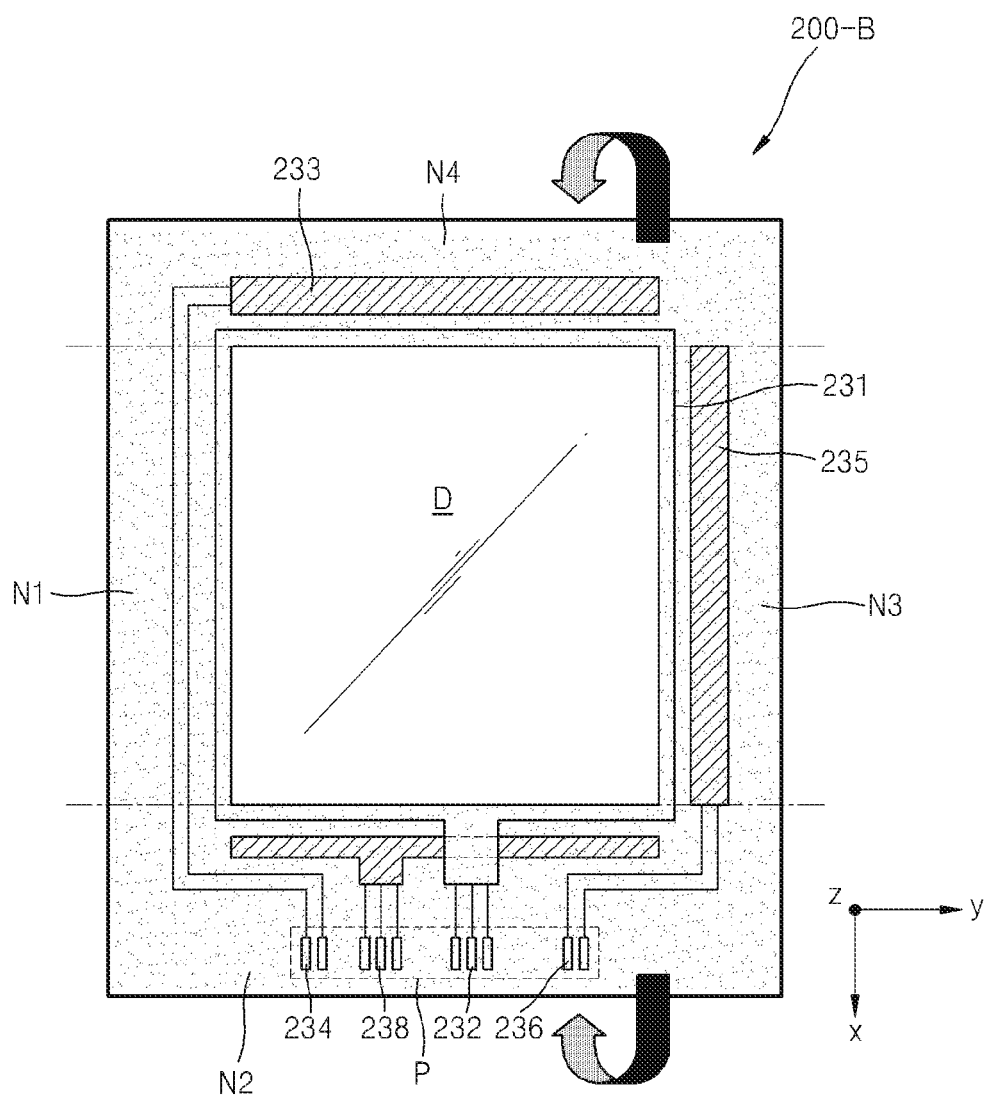
FIG. 14 is a schematic plan view of an example of a flexible display panel before non-display regions of FIG. 12 are folded.

FIG. 12 is a schematic perspective view of a flexible display panel 200 according to another embodiment of the present invention, FIG. 13 is a cross-sectional view of the flexible display panel 200 illustrated in FIG. 12, taken along a line XIII-XIII of FIG. 12, and FIG. 14 is a schematic plan view of an example of a flexible display panel 200-B before non-display regions N2 and N4 of FIG. 12 are folded.

Hereinafter, the current embodiment will be described with respect to differences to the embodiments of FIGS. 1 and 12.

Referring to FIG. 14, in the flexible display panel 200-B according to the current embodiment, the non-display regions N2 and N4 at upper and lower sides of a display region D is folded in a direction −z opposite to a direction (z-direction) in which the display region D is displayed. As a result, the flexible display panel 200 according to another embodiment of the present invention is as illustrated in FIG. 12.

Referring to FIGS. 12 and 13, the flexible display panel 200 includes the display region D and non-display regions N1, N2, N3 and N4 outside the display region D. The non-display regions N2 and N4 that face each other across the display region D among the non-display regions N1, N2, N3 and N4 are folded in a direction −z opposite to a direction z in which the display region D is displayed.

Since the non-display regions N2 and N4 are folded in the direction −z opposite to the direction z in which the display region D is displayed, when the user sees the flexible display panel 200 from a front (z-direction) of the display region D, the user recognizes a width $W_6$ at which the non-display regions N2 and N4 are folded as a border that surrounds the upper and lower sides of the display region D.

As described above, since the width $W_6$ at which the non-display regions N2 and N4 are folded becomes much smaller than an original width $W_0$ before the non-display regions N2 and N4 are folded, the user recognizes that the border of the display region D formed by the non-display regions N2 and N4 is significantly decreased. In particular, since the area of the non-display region N2 in which a pad unit P is located is large, the non-display region N2 in which the pad unit P is located is folded so that the user recognizes that the border of the display region D formed by the non-display region N2 is significantly decreased.

Figure 15:
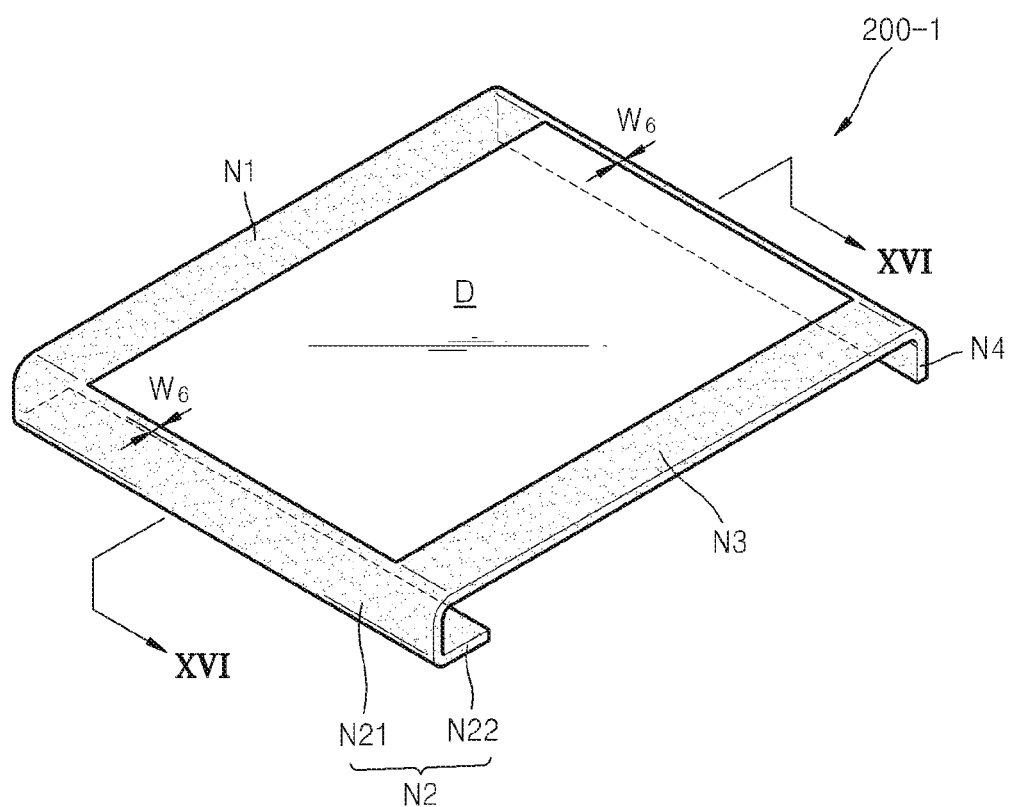
FIG. 15 is a schematic perspective view of a flexible display panel according to a modified example of FIG. 12.
Figure 16:
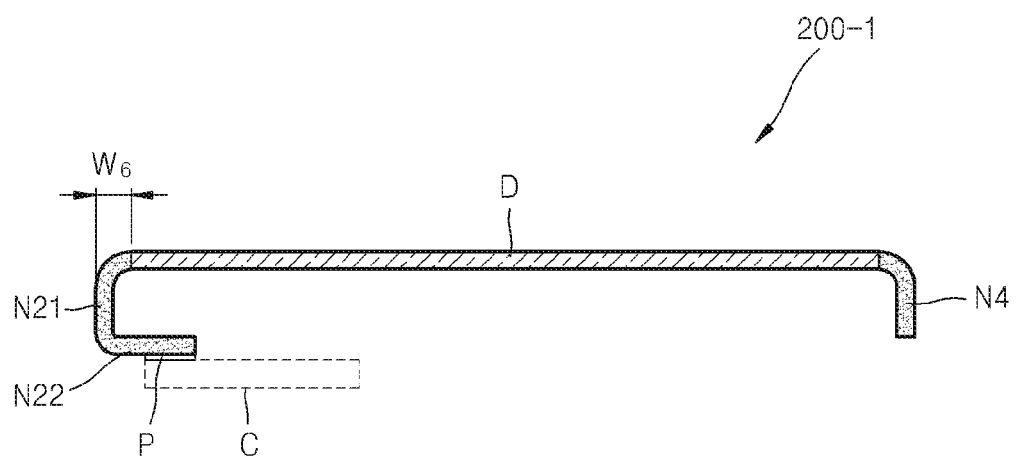
FIG. 16 is a cross-sectional view of the flexible display panel illustrated in FIG. 14, taken along a line XVI-XVI of FIG. 14.

FIG. 15 is a schematic perspective view of a flexible display panel 200-1 according to a modified example of FIG. 12, and FIG. 16 is a cross-sectional view of the flexible display panel 200-1 illustrated in FIG. 14, taken along a line XVI-XVI of FIG. 14.

Referring to FIGS. 15 and 16, a non-display region N22 of the flexible display panel 200 illustrated in FIG. 12 in which the pad unit P of the non-display region N2 is located is folded towards an inside of the flexible display panel 200-1 once again.

Since an external driver (not shown) has to be installed at the pad unit P or a connector C has to be connected to the pad unit P, when the external driver is installed at or the connector C is electrically connected to the pad unit P in the state of FIGS. 12 and 13, the width $W_6$ of the non-display region N2 that is recognized by the user is increased compared to the width $W_6$ of the non-display region N2 of the flexible display panel 200 of FIG. 12.

However, when, as in the current modified example, a region N22 of the non-display region N2 in which the pad unit P is located is folded towards the inside of the flexible display panel 200-1 once again, the external driver or the connector C is disposed inside the flexible display panel 200-1 so that the width $W_6$ of the non-display region N2 recognized by the user is not changed.

Figure 17:
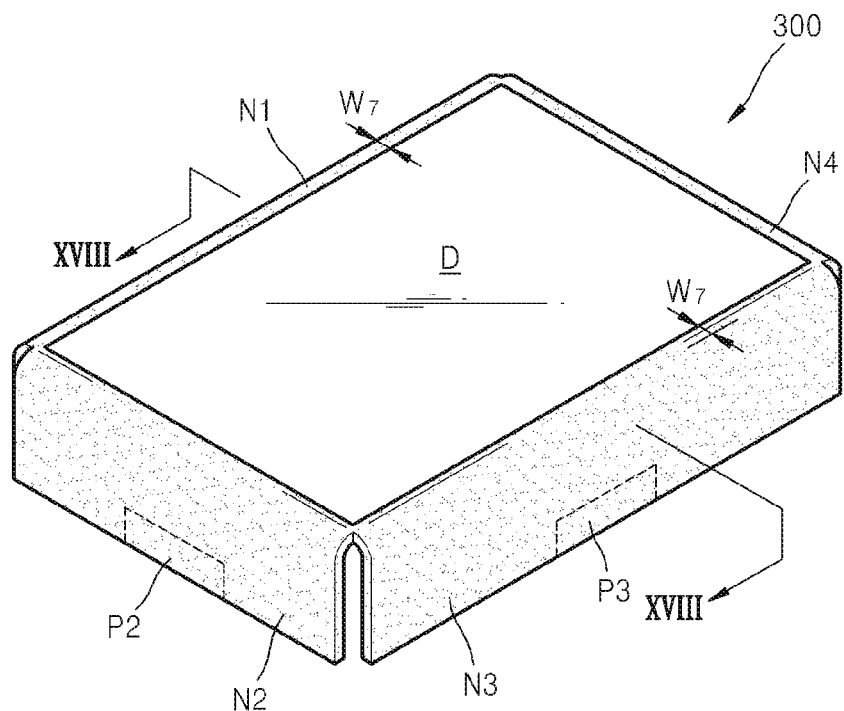
FIG. 17 is a schematic perspective view of a flexible display panel according to another embodiment of the present invention.

Although the pad unit P is located in the folded non-display region N22 in the above embodiment, aspects of the present invention are not limited thereto. That is, various circuits and wirings described above may be disposed in the folded non-display region N22. FIG. 17 is a schematic perspective view of a flexible display panel 300 according to another embodiment of the present invention, FIG. 18 is a cross-sectional view of the flexible display panel 300 illustrated in FIG. 17, taken along a line XVIII-XVIII of FIG. 17, and FIG. 19 is a schematic plan view of an example of a flexible display panel 300-B before non-display regions N1, N2, N3, and N4 of FIG. 17 are folded.

Hereinafter, the current embodiment will be described with respect to differences to the embodiments of FIGS. 1, 12, and 17.

Figure 19:
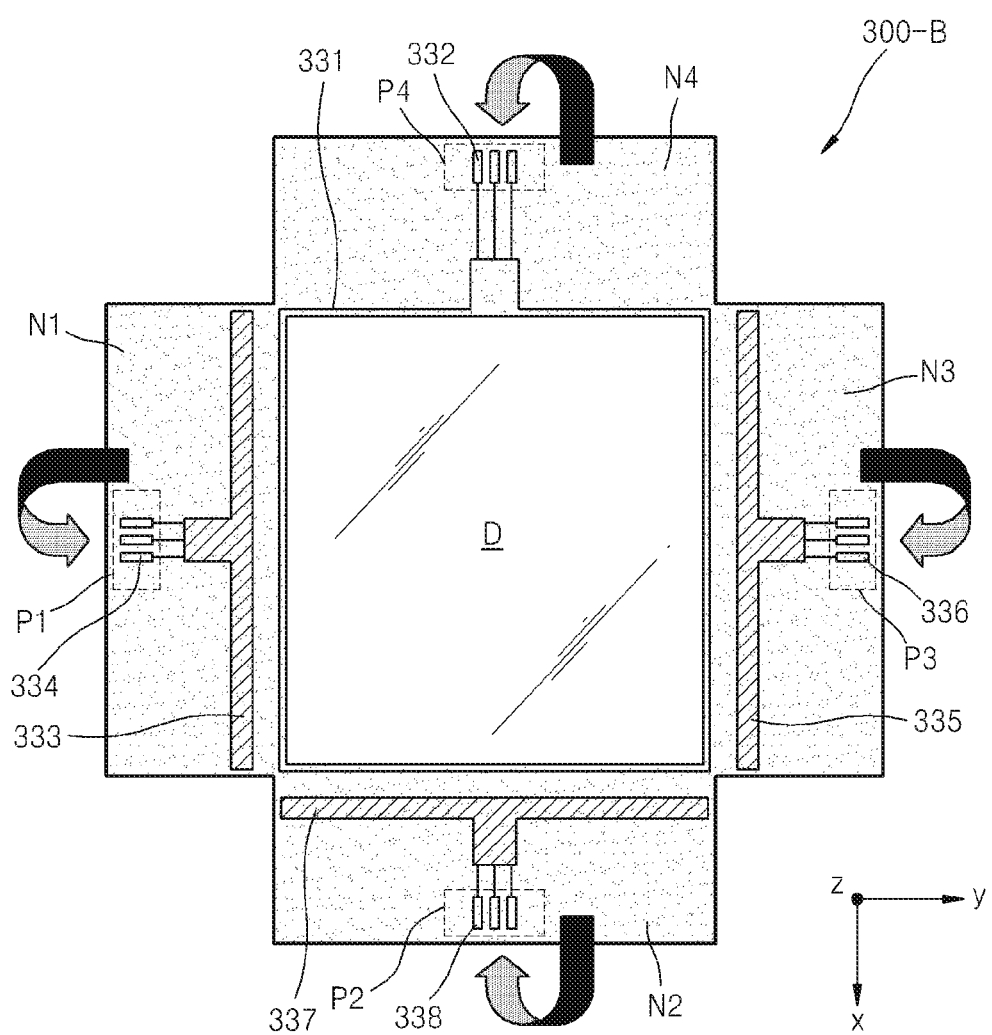
FIG. 19 is a schematic plan view of an example of a flexible display panel before non-display regions of FIG. 17 are folded.

Referring to FIG. 19, in the flexible display panel 300-B according to the current embodiment, non-display regions N1, N2, N3 and N4 at upper and lower sides and right and left sides of a display region D are folded in a direction −z opposite to a direction (z-direction) in which the display region D is displayed. As a result, the flexible display panel 300 according to the current embodiment of the present invention is constituted, as illustrated in FIG. 17.

Figure 18:
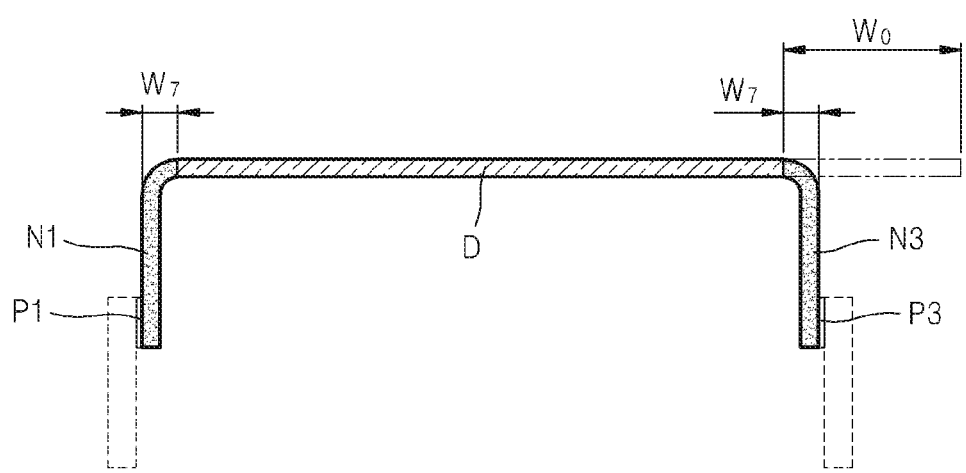
FIG. 18 is a cross-sectional view of the flexible display panel illustrated in FIG. 17, taken along a line XVIII-XVIII of FIG. 17.

Referring to FIGS. 17 and 18, the flexible display panel 300 includes the display region D and non-display regions N1, N2, N3 and N4 outside the display region D. The non-display regions N1, N2, N3 and N4 that face one another across the display region D in upward and downward directions and in right and left directions are folded in a direction −z opposite to a direction z in which the display region D is displayed.

Since the non-display regions N1, N2, N3 and N4 are folded in the direction −z opposite to the direction z in which the display region D is displayed, when the user sees the flexible display panel 300 from a front (z-direction) of the display region D, the user recognizes that a width $W_7$ at which the non-display regions N1, N2, N3 and N4 are folded as a border that surrounds the upper and lower sides and right and left sides of the display region D.

As described above, since the width $W_7$ at which the non-display regions N1, N2, N3 and N4 are folded becomes much smaller than an original width $W_0$ before the non-display regions N1, N2, N3 and N4 are folded, the user recognizes that the border of the display region D formed by the non-display regions N1, N2, N3 and N4 is significantly decreased. In particular, since the area of the non-display regions N1, N2, N3, N4 in which pad units P1, P2, P3 and P4 are respectively located is large, the non-display regions N1, N2, N3 and N4 in which the pad units P1, P2, P3 and P4 are respectively disposed are folded so that the user may recognize that the border of the display region D formed by the non-display regions is significantly decreased.

Figure 20:
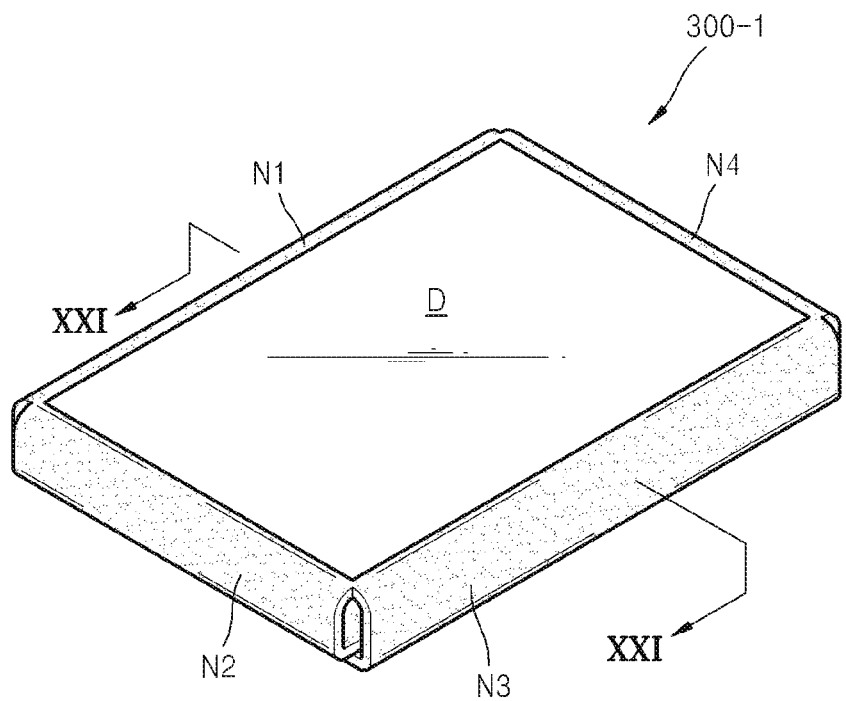
FIG. 20 is a schematic perspective view of a flexible display panel according to a modified example of FIG. 17.
Figure 21:
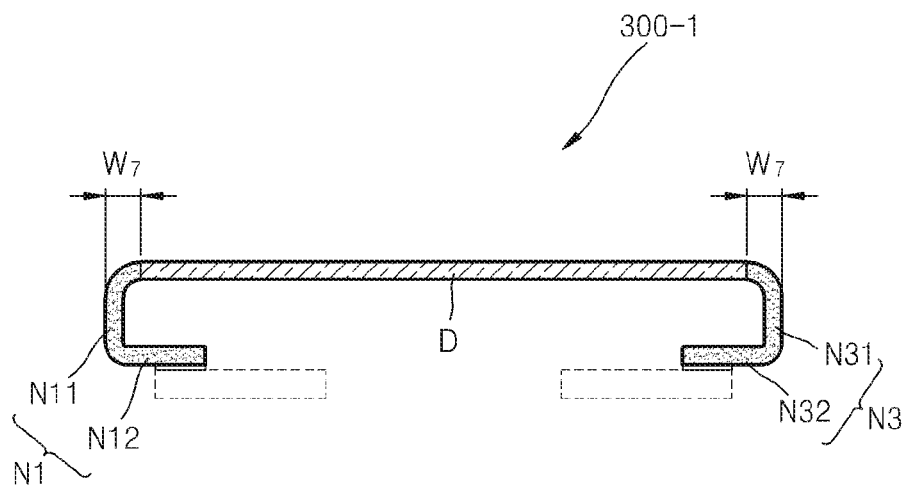
FIG. 21 is a cross-sectional view of the flexible display panel illustrated in FIG. 19, taken along a line XXI-XXI of FIG. 20.

FIG. 20 is a schematic perspective view of a flexible display panel 300-1 according to a modified example of FIG. 17, and FIG. 21 is a cross-sectional view of the flexible display panel 300-1 illustrated in FIG. 19, taken along a line XXI-XXI of FIG. 20.

Referring to FIGS. 20 and 21, non-display regions N12 and N32 of the flexible display panel 300 illustrated in FIG. 17 in which the pad units P1, P2, P3 and P4 of the non-display regions N1, N2, N3, and N4 are located are folded towards an inside of the flexible display panel 300-1 once again.

Since an external driver (not shown) has to be installed at each of the pad units P1, P2, P3 and P4 or a connector C has to be electrically connected to each of the pad units P1, P2, P3 and P4, when the external driver is installed at or the connector C is electrically connected to each of the pad units P1, P2, P3 and P4 in the state of FIGS. 17 and 18, a width $W_7$ of the non-display regions N1, N2, N3 and N4 recognized by a user is increased.

However, when, as in the current modified example, the non-display regions N12 and N32 of the non-display regions N1, N2, N3 and N4 in which the pad units P1, P2, P3 and P4 are respectively located are folded towards the inside of the flexible display panel 300-1 once again, the external driver or the connector C is disposed inside the flexible display panel 300-1 so that the width $W_7$ of the non-display regions N1, N2, N3 and N4 recognized by the user is not changed.

Although the pad units P1, P2, P3, and P4 are located in the folded non-display regions N12 and N32 in the above embodiment, aspects of the present invention are not limited thereto. That is, various circuits and wirings described above may be disposed in the folded non-display regions N12 and N32.

Figure 22:
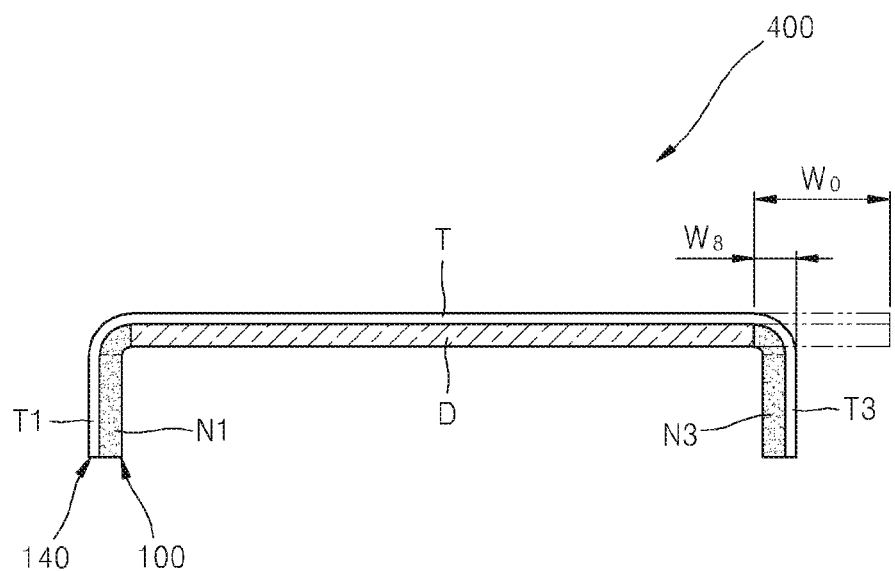
FIG. 22 is a cross-sectional view of a flexible display panel-integrated touch panel according to another embodiment of the present invention.
Figure 23:
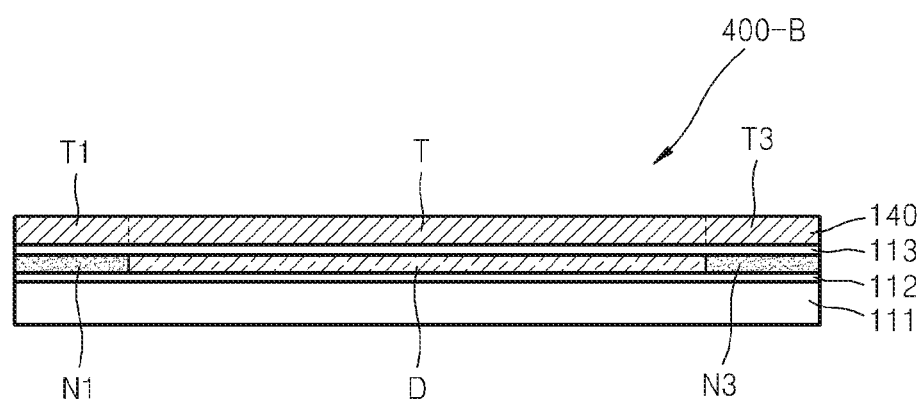
FIG. 23 is a cross-sectional view of a flexible display panel-integrated touch panel before non-display regions of the flexible display panel-integrated touch panel illustrated in FIG. 22 are folded.
Figure 24:
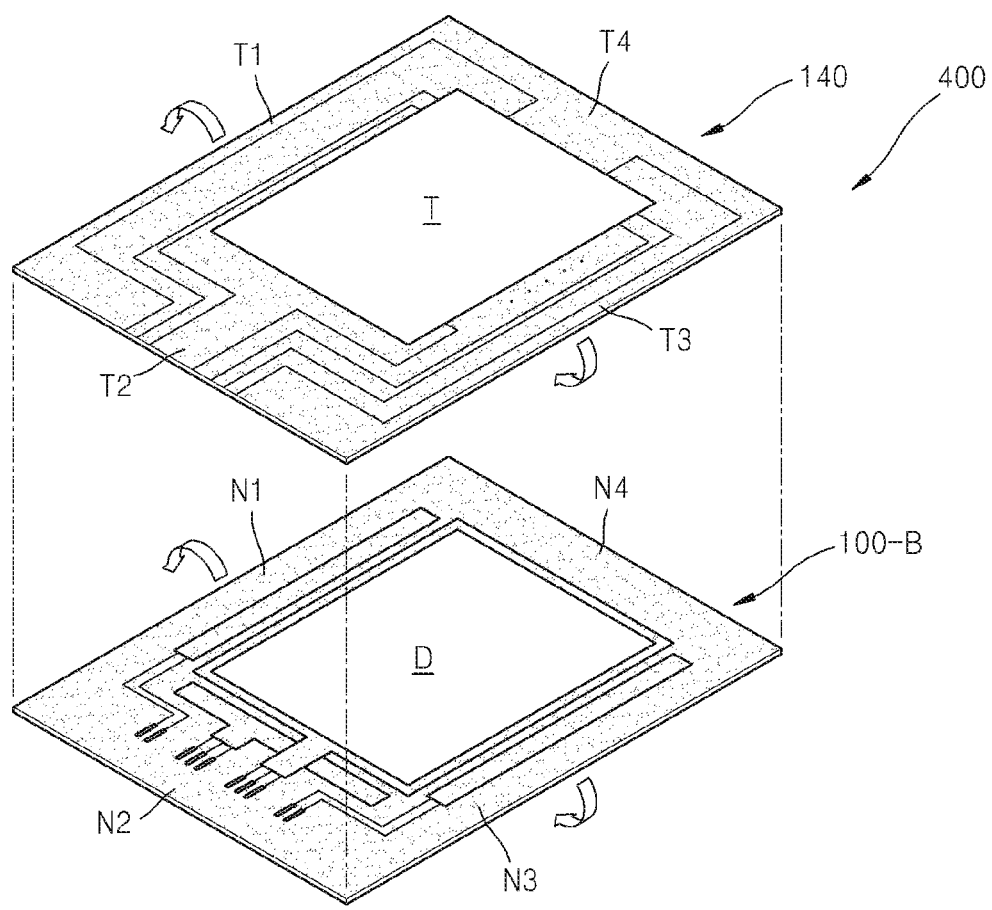
FIG. 24 is an exploded perspective view of the flexible display panel-integrated touch panel illustrated in FIG. 23.

FIG. 22 is a cross-sectional view of a flexible display panel-integrated touch panel 400 according to another embodiment of the present invention, and FIG. 23 is a cross-sectional view of a flexible display panel-integrated touch panel 400-B before non-display regions N1 and N3 of the flexible display panel-integrated touch panel 400 illustrated in FIG. 22 are folded, and FIG. 24 is an exploded perspective view of the flexible display panel-integrated touch panel 400-B illustrated in FIG. 23.

Hereinafter, the current embodiment will be described with respect to differences to the embodiments of FIGS. 1, 12, 17, and 21.

Referring to FIG. 22, the flexible display panel-integrated touch panel 400 according to the current embodiment of the present invention is constituted by attaching a touch panel 140 to the flexible display panel 100 illustrated in FIG. 1.

Referring to FIGS. 23 and 24, the touch panel 140 includes a touch region T and wiring regions T1, T2, T3 and T4 outside the touch region T. The touch panel 140 according to the current embodiment may use a variety of touch methods using capacitance overlay, a resistance film, and the like.

A flexible display panel 100-B before non-display regions are folded includes a display region D and non-display regions N1, N2, N3 and N4 outside the display region D.

The touch region T of the touch panel 140 and the display region D of the flexible display panel 100-B are aligned with each other so as to correspond to each other so that the touch panel 140 and the flexible display panel 100-B are combined with each other.

In the flexible display panel 100-B combined with the touch panel 140, the non-display regions N1 and N3 of the flexible display panel 100-B, which are on right and left sides of the display region D, are folded in a direction −z opposite to a direction z in which the display region D is displayed. As a result, the flexible display panel-integrated touch panel 400 illustrated in FIG. 22 is constituted.

Since the non-display regions N1 and N3 and the wiring regions T1, T2, T3 and T4 of the touch panel 140 are folded in the direction −z opposite to the direction z in which the display region D is displayed, when the user sees the flexible display panel-integrated touch panel 400 from the front (z-direction) of the display region D, the user recognizes that a width $W_8$ of the non-display regions N1 and N3 as a border that surrounds the right and left sides of the display region D.

As described above, since the width $W_8$ at which the non-display regions N1 and N3 are folded becomes much smaller than an original width $W_0$ before the non-display regions N1 and N3 are folded, the user recognizes that the border of the display region D formed by the non-display regions N1 and N3 is significantly decreased.

Although the flexible display panel 100-B illustrated in FIG. 1 is included in the flexible display panel-integrated touch panel 400 shown in the drawings described above, the present invention is not limited thereto, and different types of flexible display panels as those illustrated in FIGS. 1, 12, and 17 may be applied to the current embodiment.

Figure 25:
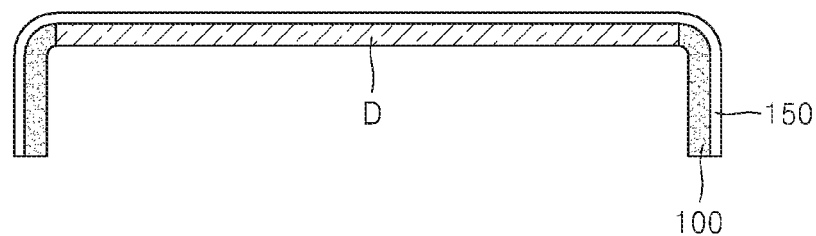
FIGS. 25 through 27 are schematic cross-sectional views of examples in which a flexible display panel is combined with a variety of support units.
Figure 26:
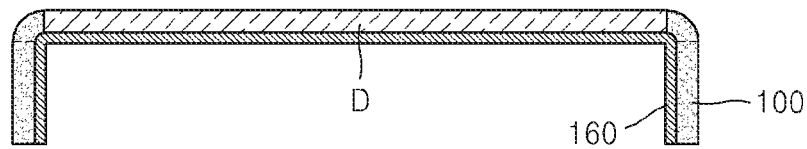
Figure 27:
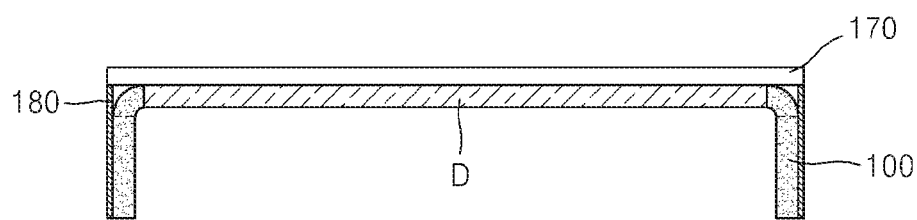

FIGS. 25 through 27 illustrate examples in which the flexible display panel 100 is combined with a variety of support units. For convenience of explanation, the flexible display panel 100 is exemplified. However, the present invention is not limited thereto and may be applied to the flexible display panel-integrated touch panel 400 illustrated in FIG. 21.

Referring to FIG. 25, the flexible display panel 100 on which a non-display region is folded, is protected and supported by a transparent protection window 150.

The transparent protection window 150 may be attached to the flexible display panel 100 to correspond to a shape of the flexible display panel 100, i.e., to correspond to a top surface of the flexible display panel 100 on which an image is displayed and a folded shape of the flexible display panel 100. That is, the transparent protection window 150 may be combined with the flexible display panel 100 so as to correspond to a shape in which the display region D and non-display regions N of the flexible display panel 100 are folded. The transparent protection window 150 has transmittance that allows light to transmit through a display screen of the flexible display panel 100 and has a strength that prevents deformation caused by a restorative force of the flexible display panel 100. Thus, the transparent protection window 150 may protect the flexible display panel 100 from external shock or scratches and may act as a support unit that supports the shape of the flexible display panel 100. Although not shown, an adhesive may be injected between the flexible display panel 100 and the transparent protection window 150.

FIG. 25 illustrates a case where the transparent protection window 150 is directly disposed on the flexible display panel 100. However, the present invention is not limited thereto and may also be applied to the flexible display panel-integrated touch panel 400 illustrated in FIG. 22. In this regard, the transparent protection window 150 may be combined with the flexible display panel 100 to correspond to the flexible display panel 100 and/or a folded shape of the flexible display panel 100.

Referring to FIG. 26, an inside of the flexible display panel 100 in which the non-display regions N are folded is supported by a support member 160. The support member 160 has a strength that prevents deformation caused by a restorative force of the flexible display panel 100. Although not shown, the adhesive may be further injected between the flexible display panel 100 and the support member 160.

Referring to FIG. 27, the flexible display panel 100 of which the non-display regions are folded is supported by a flat (not curved) transparent protection window 170. The folded portion of the flexible display panel 100 may be supported by a bezel or frame 180 that supports the flexible display panel 100 laterally. Obviously, although not shown, the adhesive may be further injected between the flexible display panel 100, the transparent protection window 170, and the bezel or frame 180.

The support units described above are examples for supporting the shape of the flexible display panel including folded non-display regions, and various applications may be possible by one of ordinary skill in the art.

As described above, the flexible display panel having a folded shape supported by various support units may be integrated with various display apparatuses, such as TVs, computer monitors, PDAs, smart phones, and the like. The ratio of non-display regions to a display region of the flexible display panel recognized by a user is significantly decreased so that an enlarged image screen compared to other display apparatuses may be provided.

A display apparatus according to the embodiments described above may provide the following effects.

First, non-display regions are bent in a direction opposite to a direction in which a display region is displayed so that a border of the display region formed by the non-display regions recognized by the user is significantly decreased.

Second, protective films are located in upper and lower portions of a flexible display panel so as to cover all of regions in which metal layers are formed, so that cracks of wirings caused by bending stress when the non-display regions are bent, may be prevented.

While this invention has been particularly shown and described with reference to preferred embodiments thereof, it will be understood by those skilled in the art that various changes in form and details may be made therein without departing from the spirit and scope of the invention as defined by the appended claims. The embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A display apparatus comprising:
a first protective film;
a flexible substrate on the first protective film;
a display region on the flexible substrate;
a first non-display region bent with respect to the display region;
a second non-display region bent with respect to the first non-display region, the second non-display region facing the display region;
a flexible encapsulation member disposed on the display region and the first non-display region;
a touch region and touch wirings outside the touch region, the touch region and touch wirings being disposed on the flexible encapsulation member, the touch region being disposed at a position corresponding to the display region, and the touch wirings being disposed at a position corresponding to the first non-display region; and
a pad unit on the second non-display region.

2. The display apparatus of claim 1, wherein the touch region and the touch wirings are bent to correspond to shapes of the display region and the first non-display region.

3. The display apparatus of claim 1, further comprising:
a transparent protective window disposed on the touch region and touch wirings,
wherein the transparent protective window functions as a support unit for maintaining shapes of the display region and the first non-display region.

4. The display apparatus of claim 3, further comprising:
a second protective film between the flexible encapsulation member and the transparent protective window.

5. The display apparatus of claim 4, further comprising:
an adhesive between the second protective film and the transparent protective window.

6. The display apparatus of claim 4, wherein the first protective film and the second protective film are arranged to be symmetrical with each other.

7. The display apparatus of claim 4, wherein the second protective film comprises a polarization film.

8. The display apparatus of claim 1, further comprising:
wiring lines outside the display region, the wiring lines being connected to the display region,
wherein the pad unit is connected to the wiring lines.

9. The display apparatus of claim 8, wherein the wiring lines comprise a first wiring line and a second wiring line facing the first wiring line,
a distance between the first wiring line and the second wiring line on a first axis is greater than a distance between the first wiring line and the second wiring line on a second axis,
the first axis is a bending axis between the display region and the first non-display region, and
the second axis is a bending axis between the first non-display region and the second non-display region.

10. The display apparatus of claim 9, wherein the touch wirings comprise a third touch wiring and a fourth touch wiring facing the third touch wiring,
a distance between the third touch wiring and the fourth touch wiring on a first axis is greater than a distance between the first wiring line and the second wiring line on a second axis.

11. The display apparatus of claim 1, wherein the flexible encapsulation member comprises layers stacked in an order of a first inorganic layer, an organic layer and a second inorganic layer.

12. A display apparatus comprising:
a first protective film;
a flexible substrate on the first protective film;
a display region on the flexible substrate;
a first non-display region bent with respect to the display region;
a second non-display region bent with respect to the display region, the second non-display region facing the first non-display region;
a third non-display region bent with respect to the display region, the third non-display region being disposed between the first non-display region and the second non-display region;
a fourth non-display region bent with respect to the display region, the fourth non-display region facing the second non-display region;
a flexible encapsulation member disposed on the display region and the first to fourth non-display regions;
a touch region and touch wirings outside the touch region, the touch region and touch wirings being disposed on the flexible encapsulation member, the touch region being disposed at a position corresponding to the display region, and the touch wirings being disposed at a position corresponding to the first to fourth non-display regions; and
a pad unit on at least one of the first to fourth non-display regions,
wherein a corner between the first non-display region and the third non-display region and a corner between the first non-display region and the fourth non-display region are cut off; and
wherein a corner between the second non-display region and the third non-display region and a corner between the second non-display region and the fourth non-display region are cut off.

13. The display apparatus of claim 12, wherein the touch region and the touch wirings are bent to respectively correspond to shapes of the display region and the first to fourth non-display regions.

14. The display apparatus of claim 12, further comprising:
a transparent protective window disposed on the touch region and touch wirings,
wherein the transparent protective window functions as a support unit for maintaining shapes of the display region and the first to fourth non-display regions.

15. The display apparatus of claim 12, further comprising:
wiring lines outside the display region, the wiring lines being connected to the display region,
wherein the pad unit is connected to the wiring lines.

16. The display apparatus of claim 12, wherein the flexible encapsulation member comprises layers stacked in an order of a first inorganic layer, an organic layer and a second inorganic layer.

17. A display apparatus comprising:
a first protective film;
a flexible substrate on the first protective film;
a display region on the flexible substrate;
a first non-display region bent with respect to the display region;
a second non-display region bent with respect to the display region, the second non-display region facing the first non-display region;
a third non-display region bent with respect to the display region, the third non-display region being disposed between the first non-display region and the second non-display region;
a fourth non-display region bent with respect to the display region, the fourth non-display region facing the second non-display region;
a flexible encapsulation member disposed on the display region and the first to fourth non-display regions;
a touch region and touch wirings outside the touch region, the touch region and touch wirings being disposed on the flexible encapsulation member, the touch region being disposed at a position corresponding to the display region, and the touch wirings being disposed at a position corresponding to the first to fourth non-display regions;
a pad unit on at least one of the first to fourth non-display regions, and
a transparent protective window disposed on the touch region and touch wirings,
wherein the transparent protective window functions as a support unit for maintaining shapes of the display region and the first to fourth non-display regions,
wherein a corner between the first non-display region and the third non-display region and a corner between the first non-display region and the fourth non-display region are cut off; and wherein a corner between the second non-display region and the third non-display region and a corner between the second non-display region and the fourth non-display region are cut off, wherein the display apparatus further comprises:

a second protective film between the flexible encapsulation member and the transparent protective window.

18. The display apparatus of claim 17, further comprising:

an adhesive between the second protective film and the transparent protective window.

19. The display apparatus of claim 18, wherein the first protective film and the second protective film are arranged to be symmetrical with each other.

20. The display apparatus of claim 17, wherein the second protective film comprises a polarization film.

* * * * *